United States Patent
Jin et al.

(12)

(10) Patent No.: US 6,844,237 B1
(45) Date of Patent: Jan. 18, 2005

(54) METHOD FOR IMPROVING DIELECTRIC POLISHING

(75) Inventors: Bo Jin, Campbell, CA (US); Andrey Zagrebelny, Eagan, MN (US); Matthew Buchanan, Edina, MN (US)

(73) Assignee: Cypress Semiconductor Corporation, San Jose, CA (US)

( * ) Notice: Subject to any disclaimer, the term of this patent is extended or adjusted under 35 U.S.C. 154(b) by 509 days.

(21) Appl. No.: 09/774,323

(22) Filed: Jan. 31, 2001

(51) Int. Cl.$^7$ ............................................. H01L 21/302
(52) U.S. Cl. ...................... 438/424; 438/692; 438/725; 438/757; 438/694; 438/700
(58) Field of Search ................................. 438/692, 693, 438/725, 424, 694, 757, 700; 216/88, 89

(56) References Cited

U.S. PATENT DOCUMENTS 5,738,757 A * 4/1998 Burns et al. ................ 438/603
5,981,353 A * 11/1999 Tsai ............................ 438/424

* cited by examiner

Primary Examiner—George A. Goudreau
(74) Attorney, Agent, or Firm—Bradley T. Sako

(57) ABSTRACT

According to one embodiment, a shallow trench isolation (STI) method (500) may include forming an etch mask layer over both a first and second substrate side (504). An etch mask layer over a first substrate side (506) may be patterned to form a STI etch mask, and trenches may be etched into a substrate (508). A trench dielectric layer can be formed over a first substrate side (510). An etch mask layer formed over a second substrate side can be etched (512), reducing and/or eliminating stress that may deform a substrate or otherwise adversely affect STI features. A trench dielectric may then be chemically-mechanically polished (step 514).

18 Claims, 3 Drawing Sheets

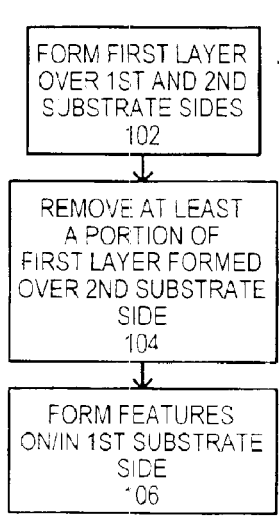
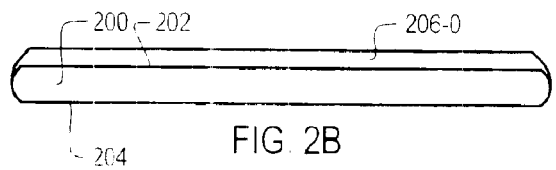
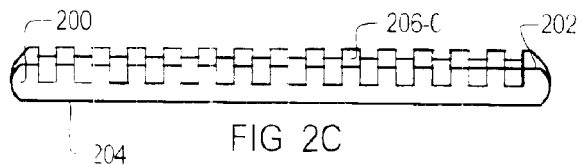
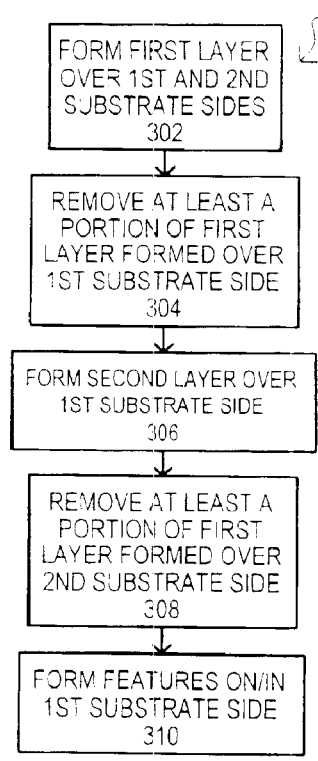
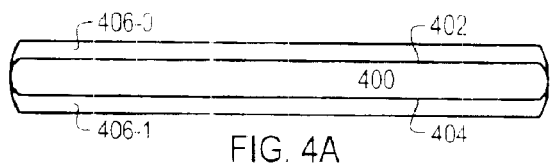
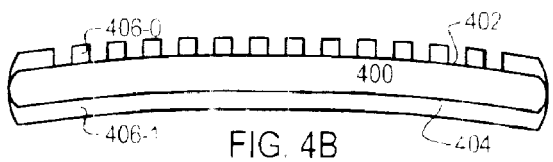
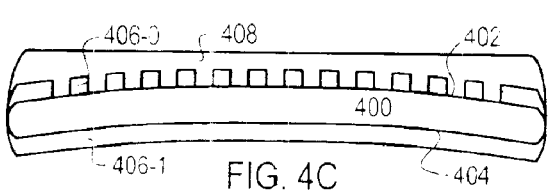
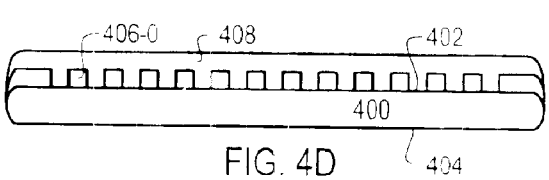
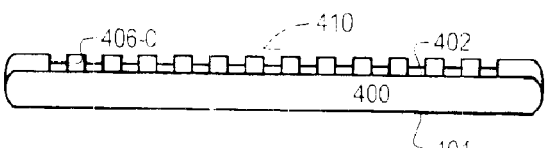

METHOD FOR IMPROVING DIELECTRIC POLISHING

TECHNICAL FIELD

The present invention relates generally to manufacturing processes for electronic and/or optical devices, and more particularly to processes that polish a surface of a substrate in which such devices can be formed.

BACKGROUND OF THE INVENTION

Electronic devices as well some optical devices, are typically manufactured by a sequence of steps, each of which can deposit and/or modify a layer formed in (or on) a substrate surface. In many cases such a surface is a wafer having opposing sides.

Forming layers on a wafer can be directional, non-directional or some combination thereof. In a directional formation process, a wafer may be situated on a chuck or platen. A layer may then be formed, by deposition or the like, on a top surface of a wafer. In a non-directional formation process, a wafer may be situated within a wafer boat, or other carrying structure, that can expose both sides of a wafer. A wafer boat may be situated within a furnace or the like, and a layer may be formed on both sides of a wafer.

Devices formed on substrates are typically manufactured in large numbers by taking advantage of uniformity across a substrate surface. As device features continue to shrink, it can be more difficult to achieve uniformity due to various effects. One effect that can result in variations in device features can be mechanical stress introduced by one or more layers. An example of such a feature variation will now be described.

Referring now to FIGS. 7A to 7F, a conventional method of forming shallow trench isolation (STI) in a semiconductor substrate is shown in a series of side cross sectional views.

FIG. 7A shows a substrate 700 having a first side 702 and a second side 704. A substrate 700 can include a wafer of essentially monocrystalline silicon, as but one example. A layer of silicon dioxide 706 may be formed on a first side 702. In addition, a layer of silicon nitride may be formed in a non-directional manner. Consequently, there may be a first side silicon nitride layer 708-0 formed over a first side 702, and a second side silicon nitride layer 708-1 formed over a second side 704.

FIG. 7B shows the formation of an etch mask 710 from a first side silicon nitride layer 708-0. An etch mask may be formed by first developing an etch mask pattern with photoresist according to photolithographic or other methods. A first side silicon nitride layer 708-0 may then be etched using the developed photoresist as a mask, to form an etch mask 710.

FIG. 7C shows a substrate 700 after substrate etching that may form substrate trenches, one of which is shown as item 712. FIG. 7B shows how a substrate 700 may be warped due to stress and/or mismatches in stress between a first side silicon nitride layer 708-0 (now an etch mask 710) and second side silicon nitride layer 708-1.

It is understood that the various features of FIGS. 7A to 7F are shown in exaggerated form. In particular wafers may be about eight inches in diameter, while trench widths can be as small as 0.2 $\mu$m or less. Likewise, the particular curvature shown is exaggerated to better understand the drawbacks of a conventional approach such as that shown in FIGS. 7A to 7F.

FIG. 7D shows the formation of a trench dielectric 714. A trench dielectric 714 may be formed with a directional process over a first substrate side 702. In one particular example, a trench dielectric 714 may include silicon dioxide formed with a high density plasma, as but one example.

FIG. 7E shows a planarization step that can planarize a trench filling layer 714. A planarization step may include chemical-mechanical polishing. As but one example, a substrate 700 may be placed, first side 702 down, on a moving polishing pad that can be covered with a slurry.

Ideally, chemical-mechanical polishing can result in trenches 712 that may be filled to a uniform height. However, as shown in FIG. 7F, due to mechanical stress that may warp a substrate, trenches 712-0 in a center portion of a substrate 700-0 may be filled to a lower height than trenches 712-½ in more peripheral portions 700-1 and 700-2. Differences in trench fill height may adversely affect isolation properties of a resulting integrated circuit device.

In light of the above, it would be desirable to arrive at some way of reducing feature variations that may be introduced by mechanical stress of one or more layers. Even more particularly, it would be desirable to arrive at some way of improving a dielectric polishing in a device formed on a substrate.

SUMMARY OF THE INVENTION

According to one embodiment, a method may include forming a first layer over a first and second substrate surface. A portion of the first layer formed over the first substrate surface may then be patterned. Such a patterning may result in stress or a mismatch of stress between substrate sides. At least a portion of a first layer over a second substrate surface may then removed, reducing or eliminating the adverse effects of the above-noted stress.

According to one aspect of the above embodiment, a first layer may include a silicon nitride layer that may be patterned into a shallow trench isolation (STI) etch mask.

According to another aspect of the embodiments, a second layer may be formed over a first substrate side. A second layer may comprise a silicon dioxide layer formed over a silicon nitride STI etch mask. Removing a first layer from a second substrate side may include a wet chemical etch. A second layer may protect a silicon nitride etch mask froth such a wet chemical etch.

BRIEF DESCRIPTION OF THE DRAWINGS

FIG. 1 is a flow diagram of a first embodiment.

FIGS. 2A to 2C are side cross sectional views showing the method of FIG. 1.

FIG. 3 is a flow diagram of a second embodiment.

FIGS. 4A to 4E are side cross sectional views showing the method of FIG. 3.

DETAILED DESCRIPTION OF THE EMBODIMENTS

Figure 5:
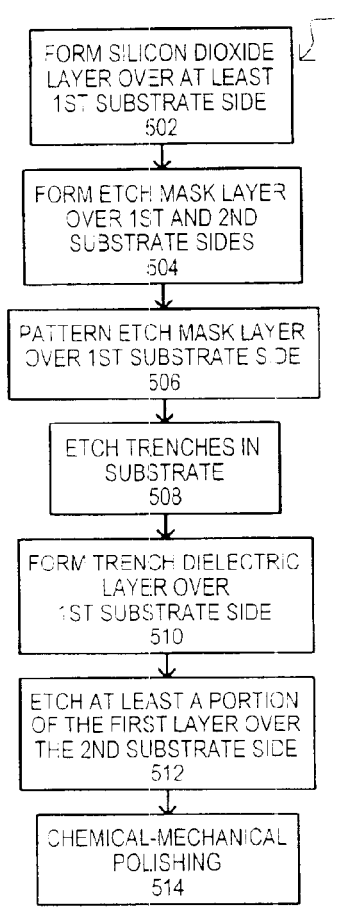
FIG. 5 is a flow diagram of a third embodiment.

Various embodiments will now be described in conjunction with a number of diagrams. The embodiments set forth a method of forming devices on (or in) a substrate that may reduce feature variations that can result from mechanical stress of one or more layers.

It is understood that the features of the various embodiments are shown in exaggerated form. Similarly, any curvature/deformation of a substrate is also shown in exaggerated form.

A first embodiment will now be described with reference to FIGS. 1 and 2A to 2C. A first embodiment is designated by the general reference character 100 and may include forming a first layer on first side and second side of a substrate (step 102). FIG. 2A shows an example of a substrate 200 following a step 102. A substrate 200 may include a first substrate side 202 and a second substrate side 204. A first layer may be formed over first and second substrate sides (202 and 204), and may thus include a first part 206-0 formed over a first substrate side 202 and a second part 206-1 formed over a second substrate side 204. As but one example, a first layer (206-0 and 206-1) may be formed by a non-directional process step, such as a furnace deposition step.

A first embodiment 100 may further include removing at least a portion of the first layer that is formed over a second substrate side (step 104). FIG. 2B shows an example of a substrate 200 following a step 104. In the example of FIG. 2B, essentially all of a second part 206-1 has been removed. Removing at least a portion of a second part 206-1 may reduce adverse effects, such as feature non-uniformity, that may be introduced by mechanical stress of a second part and/or mismatches in stress between a first and second parts.

A first embodiment 100 may continue with the formation of features 208 on, and/or in, a first substrate side 204. Such features may include, for example, a polished dielectric layer.

A second embodiment will now be described with reference to FIGS. 3 and 4A to 4E. A second embodiment is designated by the general reference character 300 and may include forming a first layer on a first side and second side of a substrate (step 302). FIG. 4A shows an example of a substrate 400 following a step 302. A substrate 400 may include a first substrate side 402 and a second substrate side 404. A first layer may be formed over first and second substrate sides (402 and 404), and may thus include a first part 406-0 formed over a first substrate side 202 and a second part 406-1 formed over a second substrate side 204.

A second embodiment 300 may further include removing at least a portion of the first layer that is formed over a first substrate side (step 304). FIG. 4B shows an example of a substrate 400 following a step 304. In the example of FIG. 4B, a portion of a first part 406-0 has been removed. As but one example, a first part 406-0 may be patterned with an etch step or the like. A second part 406-1 may remain essentially intact. Removing at least a portion of a first part 406-0 may result in a mismatch in mechanical stress between a first part 406-0 and a second part 406-1. Consequently, a substrate 400 may be deformed in some fashion. Such a deformation can result in variations in features over a substrate.

A second embodiment 300 may further include forming a second layer over a first substrate side (step 306). FIG. 4C shows an example of a substrate 400 following a step 306. In the example shown, a second layer 408 may cover essentially all of a first substrate side 402.

A second embodiment 300 may further include removing at least a portion of the first layer that is formed over a second substrate side (step 308). FIG. 4D shows an example of a substrate 400 following a step 308. In the example of FIG. 4D, essentially all of a second part 406-1 has been removed. Removing at least a portion of a second part 406-1 may reduce and/or compensate for adverse stress effects, such as curvature or the like, related to stress and/or stress differences between first and second parts (406-0 and 406-1). In one particular approach, a second part 406-1 may be removed by etching with a high degree of selectivity between a second layer 408 and a second part 406-1. In such an arrangement, a second layer 408 may serve essentially as an etch mask that can protect a first part 406-0 from being removed when a second part 406-1 is being removed.

As in the case of a first embodiment 100, a second embodiment 300 may continue with the formation of features 410 on, and/or in, a first substrate side 402. Such features may include, for example, a polished dielectric layer.

While the above embodiments may be applied to various problems that may arise in a manufacturing process, the present invention may be particularly applicable to forming a shallow trench isolation (STI) dielectric layer that may be more uniform than conventional approaches. A particular embodiment illustrating such an application is shown in FIGS. 5 and 6A to 6G.

Figure 6A:
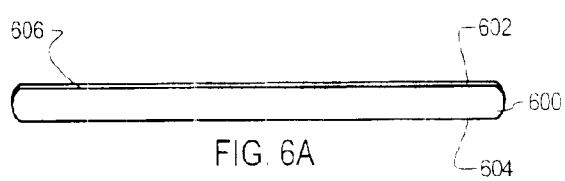
FIGS. 6A to 6G are side cross sectional views showing the method of FIG. 5.

Referring now to FIG. 5, a third embodiment 500 may include forming a silicon dioxide layer on at least a first substrate side (step 502). FIG. 6A shows an example of a substrate 600 following a step 502. A substrate 600 may include an essentially monocrystalline silicon wafer having a first substrate side 602 and a second substrate side 604. A layer of silicon dioxide 604 may be formed over at least a first substrate side 602. A silicon dioxide layer 606 may be formed by oxidizing a substrate 600. In addition or alternatively, such a silicon dioxide layer may be formed by depositing silicon dioxide with low pressure chemical vapor deposition (LPCVD), or the like. A silicon dioxide layer may have a thickness less than 500 Å, more particularly less than 250 Å, even more particularly less than 130 Å.

Figure 6B:
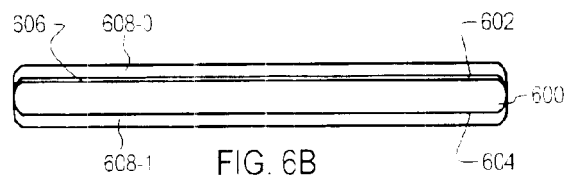

A third embodiment 500 may also include forming an etch mask layer on first and second substrate side (step 504). A step 504 may include forming a layer of silicon nitride on both sides of a substrate. As just one example, silicon nitride may be formed on top and bottom surfaces of wafers within a furnace. A substrate 600 following a step 504 is shown in FIG. 6B. A first etch mask portion 608-0 can be formed over a first substrate surface 602 and a second etch mask portion 608-1 can be formed over a second substrate surface 604. A first etch mask portion 608-0 may comprise silicon nitride having a thickness of less than 5000 Å, more particularly less than 3000 Å, even more particularly less than 2000 Å.

Figure 6C:
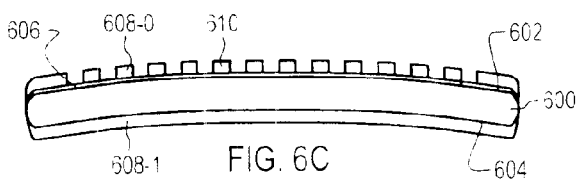

A third embodiment 500 may further include patterning a first etch mask portion (step 506). A step 506 may include depositing a layer of photoresist over a first etch mask portion, and patterning such photoresist to define STI trench locations. Such photoresist may then serve as an etch mask to pattern a first etch mask portion. Once a first etch mask portion is patterned into a STI etch mask, photoresist may be removed. A substrate 600 following a step 506 is shown in FIG. 6C. Patterning a first etch mask portion can form a STI etch mask 610. A STI etch mask 610 may have openings corresponding to the desired location of a STI trench.

Figure 6D:
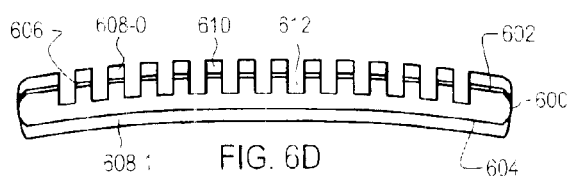

As shown in exaggerated form in FIG. 6D, forming a STI etch mask 610 can result in deformation of a substrate 600.

Once a STI etch mask is formed, trenches may be etched into a substrate (step 508). A substrate following a step 508 is shown in FIG. 6D. A substrate 600 may be etched with a silicon etch to form trenches 612. Trenches may have a depth of less than 5,000 Å, more particularly less than 4,000 Å, even more particularly about 3,000 Å. Silicon etching may include a reactive ion etch, as but one example.

Figure 6E:
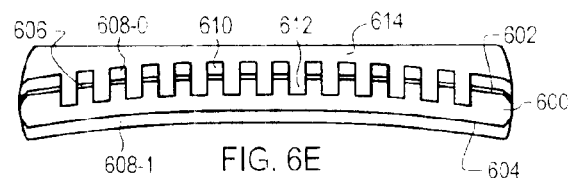

Referring once again to FIG. 5, a third embodiment 500 may include forming a trench dielectric layer over a first substrate side (step 510). A substrate 600 following a step 510 is shown in FIG. 6E. A trench dielectric 614 may comprise silicon dioxide, such as undoped silicate glass (USG) and/or doped silicate glass including phosphosilicate glass (PSG) and/or borophosphosilicate glass (BPSG). In one particular arrangement, a trench dielectric may be deposited with a high density plasma.

Figure 6F:
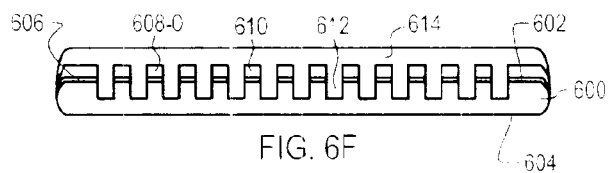
Figure 6G:
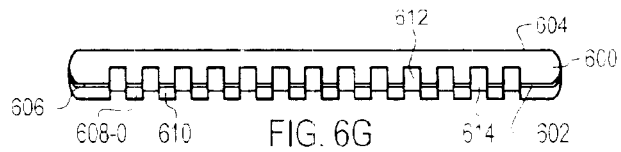
Figure 7A:
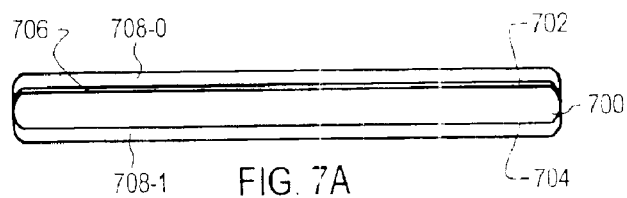
FIGS. 7A to 7F are side cross sectional views showing a conventional method of polishing a dielectric on a substrate.
Figure 7B:
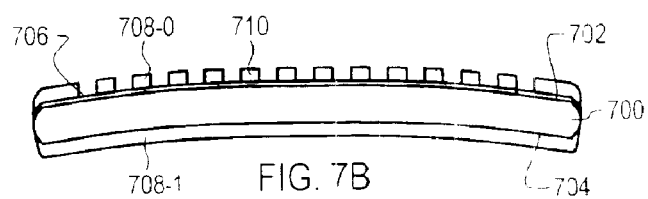
Figure 7C:
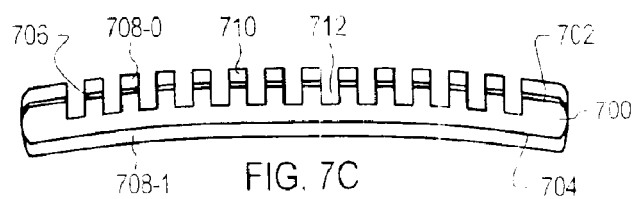
Figure 7D:
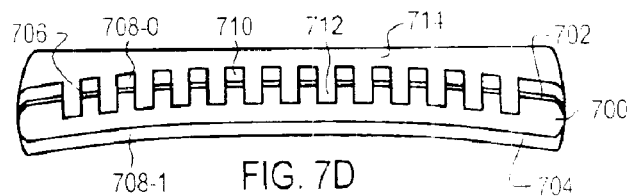
Figure 7E:
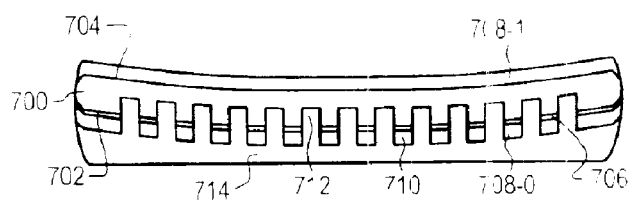
Figure 7F:
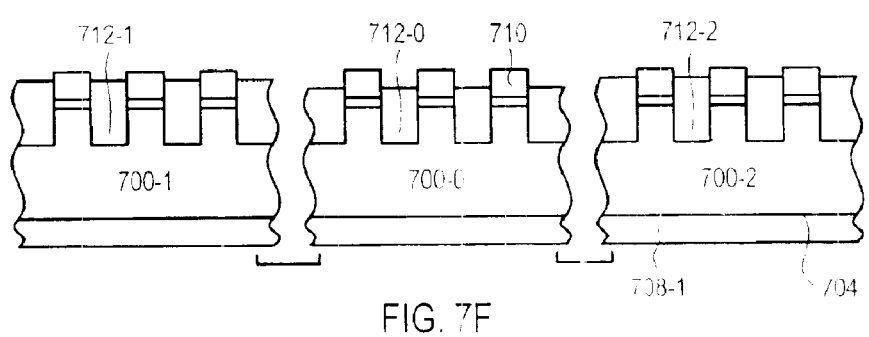

A third embodiment 500 may further include etching at least a portion of a second etch mask portion (step 512). A substrate 600 following a step 512 is shown in FIG. 6F. Etching at least a portion of a second etch mask portion 608-1 may include isotropically etching a substrate 600 on both a first and second side. More particularly, a wet chemical having a high degree of selectivity between a trench dielectric and a second etch mask portion can remove all, or essentially all of a second etch mask portion. Even more particularly, a phosphoric acid etch can remove a silicon nitride second etch mask portion while a silicon dioxide trench dielectric protects a silicon nitride first etch mask portion from such an etch. Of course, while a wet chemical etch presents a preferred removal method, alternate etches may remove a second etch mask portion 608-1. As but one example, a second etch mask portion 608-1 may be removed with an anisotropric or isotropic plasma etch.

Removing at least a portion of a second etch mask portion 608-1 may reduce and/or eliminate substrate deformation, as set forth in FIG. 6F.

A third embodiment 500 can continue with chemical-mechanical polishing (CMP) (step 514). Such a step may include polishing a first substrate surface with CMP slurry that may planarize a trench dielectric layer. Because removing at least a portion of a second etch mask portion 608-1 can relieve adverse stress effects, STI features may be more uniform than conventional approaches. More particularly, trench dielectric height may be more uniform across a substrate than other conventional approaches.

It is understood that while the various particular embodiments have been set forth herein, methods and structures according to the present invention could be subject to various changes, substitutions, and alterations without departing from the spirit and scope of the invention. Accordingly, the present invention is intended to be limited only as defined by the appended claims.

What is claimed is:

1. A method, comprising the steps of:

forming a first layer comprising deposited silicon nitride over a first and second side of a substrate:

maintaining the second side of the substrate essentially free of any other overlying layers;

removing at least a portion of the first layer formed over the second side of the substrate; and forming device features on the first side of the substrate.

2. The method of claim 1, wherein:

removing at least a portion of the first layer formed over the second side of the substrate includes wet chemically etching with phosphoric acid.

3. The method of claim 1, wherein:

the layer of silicon nitride has a thickness of less than 3,000 Å.

4. The method of claim 1, wherein:

removing at least a portion of the first layer formed over the second side of the substrate includes isotropically etching.

5. The method of claim 1, wherein:

forming device features includes polishing a dielectric layer.

6. The method of claim 5, wherein:

polishing the dielectric layer includes chemical-mechanical polishing a shallow trench dielectric layer.

7. The method of claim 1, further including:

removing at least a portion of the first layer formed over the first side of the substrate.

8. The method of claim 7, wherein:

removing at least a portion of the first layer formed over the first side of the substrate include forming a shallow trench isolation etch mask.

9. The method of claim 1, further including:

forming a second layer over the first side of the substrate; and removing at least a portion of the first layer formed over the second side of the substrate includes etching with a high degree of selectivity between the first layer and the second layer.

10. The method of claim 9, where:

the second layer comprises silicon dioxide.

11. A method, comprising the steps of:

forming a first layer that includes a first part formed over a first substrate side and a second part formed over a second substrate side;

forming a second layer over the first part while maintaining the second substrate side essentially free of any other additional layers;

removing at least a portion of the second part; and after removing at least the portion of the second part, forming features on the first substrate side.

12. The method of claim 11, further including;

patterning the first part before forming the second layer.

13. The method of claim 11, wherein:

removing at least a portion of the second part includes etching essentially all of the second part.

14. The method of claim 13, further including:

the second layer serves as an etch mask to prevent etching of the first part.

15. A shallow trench isolation (STI) method, comprising the steps of:

forming a trench etch mask layer over a first and second substrate side, the trench etch mask layer including a layer of silicon nitride deposited over the first and second substrate sides;

maintaining the second substrate side essentially free of any additional overlying layers; and removing at least a portion of the trench etch mask layer that is formed over the second substrate side.

16. The STI method of claim 15, further including:

patterning the trench etch mask layer formed over the first substrate side and forming a trench dielectric over the first substrate side.

17. The STI method of claim 16, further including:

etching a substrate to form trenches having a depth of less than 4,000 angstroms with the patterned trench etch mask layer as an etch mask.

18. The STI method of claim 16, further including:

chemical-mechanical polishing the trench dielectric.

* * * * *